United States Patent [19]

Morimoto et al.

[11] Patent Number: 4,883,980
[45] Date of Patent: Nov. 28, 1989

[54] SEMICONDUCTOR IC (INTEGRATED CIRCUIT) DEVICE

[75] Inventors: Toshiki Morimoto, Kawasaki; Seiji Watanabe, Yokohama, both of Japan

[73] Assignee: Kabushiki Kaisha Toshiba, Kawasaki, Japan

[21] Appl. No.: 238,229

[22] Filed: Aug. 26, 1988

[30] Foreign Application Priority Data

Aug. 27, 1987 [JP] Japan .................. 62-213545

[51] Int. Cl.$^4$ ............. H01L 27/10; H01L 23/50; H01L 23/52; H03K 3/01
[52] U.S. Cl. ............ 307/465.1; 307/482.1; 307/303.1; 357/45; 357/42; 357/68
[58] Field of Search ......... 307/465.1, 482.1, 303.1, 307/303.2; 357/42, 45, 40, 68

[56] References Cited

U.S. PATENT DOCUMENTS 3,818,289 6/1974 Mudge et al. ............. 307/465.1 X
4,523,106 6/1985 Tanaizawa et al. ......... 307/465.1
4,575,745 3/1986 Sharma et al. ............. 357/45

FOREIGN PATENT DOCUMENTS 61-2342 8/1986 Japan .

OTHER PUBLICATIONS

Trimberger, "Automating Chip Layout", IEEE Spectum, vol. 19, No. 6, pp. 38–45, Jun. 1982.

Primary Examiner—Stanley D. Miller
Assistant Examiner—David R. Bertelson
Attorney, Agent, or Firm—Finnegan, Henderson Farabow, Garrett and Dunner

[57] ABSTRACT

A semiconductor integrated circuit device is disclosed which comprises a plurality of cell rows each including a plurality of standard cells, signal connection cells provided one at each of the cell rows and located on one straight line across that cell row array, a line for connection cells which is connected to the signal connection cell and adapted to supply a signal which is propagated via the signal connection cell to the cell in the corresponding cell row, and cell-to-cell connection lines each connecting the signal connection cells together and having a broader connection width than that of an ordinary connection line. In the semiconductor integrated circuit device of the present invention the respective signal connection cells are connected together by the cell-to-cell connection line having a broader connection width than that of the ordinary connection line, so that a signal is propagated to the respective cell row in a low-resistance way. The respective signal connection cells are each arranged at the respective cell row in a manner to be located on a single straight line to achieve the reduction of a distance between the signal connection lines. Since a signal coming from the signal connection cell at each cell row is supplied in a row unit to the associated cell in the respective cell row via the connection line for cell rows, a signal propagation over a minimum connection line length is assured.

5 Claims, 5 Drawing Sheets

SEMICONDUCTOR IC (INTEGRATED CIRCUIT) DEVICE

BACKGROUND OF THE INVENTION

1. Field of the Invention

The present invention relates to a semicustom semiconductor IC (integrated circuit) device and, in particular, to a semiconductor IC device having signal lines for supplying a signal, such as a clock signal, to any places of an associated circuit.

2. Description of the Related Art

Figure 1:
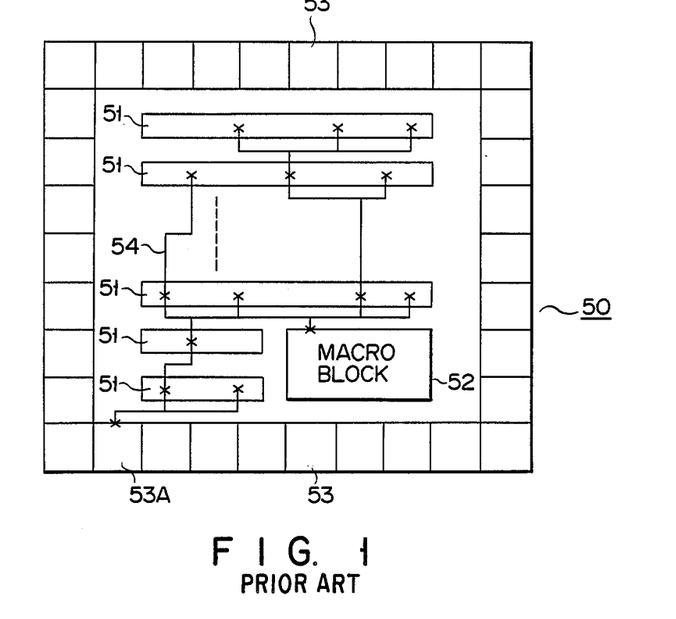
FIG. 1 is a plan view showing a pattern of a conventional semicustom semiconductor integrated circuit device.

FIG. 1 is a plan view showing a pattern of a conventional standard cell-or gate array-type semiconductor IC device. In FIG. 1, reference numeral 50 shows an IC chip body including a plurality of cell rows 51 each constituted by a plurality of standard cells and macroblock 52, such as a memory. A plurality of I/O cells 53 are provided around chip body 50. Of these IO cells, cell 53A is of a clock driver type which has a greater drive capability and receives a clock signal. The clock signal is amplified at cell 53A and supplied via signal lines 54 to an associated cell in respective cell row 51.

Figure 2:
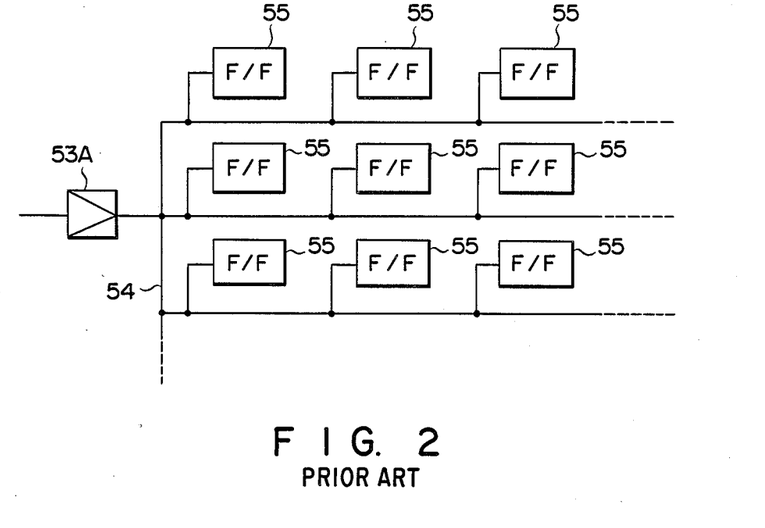
FIG. 2 is an equivalent circuit showing a relation between a clock driver cell and standard cells in respective cell rows in the conventional semicustom semiconductor integrated circuit of FIG. 1.

FIG. 2 is an equivalent circuit showing a relation of a signal connection between the clock driver cell and the standard cells in the respective cell row. In FIG. 2, reference numerals 55 show standard cells, such as flip-flops (F/F), which are arranged in the respective cell rows and need an associated clock signal.

In the aforementioned semicustom integrated circuit, the connection layout of signal lines 54 for supplying a clock signal is implemented by randomly finding unconnected areas by virtue of a layout CAD, resulting in the connection line being excessively longer. For this reason, the associated signal lines have a resistance too great to be disregarded and a signal is supplied to the respective cell with a different delay time.

With an increase in the scale of an integrated circuit involved, an output waveform from the clock driver cell is distorted, sometimes prominently, depending upon the distance from the clock driver cell to the respective associated cell. If that signal is a clock signal, the integrated circuit involves a problem, such as a clock skew, thus failing to perform a normal operation. This problem cannot be resolved with the use of a clock driver cell of a greater driving capability, because it is caused by the resistance of the signal line per se. That is to say, in the conventional device, the connection length of the signal line becomes excessively longer and the signal is supplied to the associated cells with a different delay time and hence with a different phase. Furthermore, the signal waveform becomes distorted prominently at the far end cell or cells.

SUMMARY OF THE INVENTION

It is accordingly the object of the present invention to provide a semiconductor integrated circuit device which can attain the reduction of a signal line length and achieve a low resistance feature with the result that the deformation and phase shift of a signal waveform can be reduced.

According to the present invention, a semiconductor integrated circuit device is provided which comprises:

a plurality of cell rows each having a plurality of standard cells;

signal connection cells provided at the respective cell row in a manner to be located on a single straight line;

a connection line for cell rows which is connected to the signal connection cells and adapted to supply a signal which is propagated via the signal connection cell to the associated cell in the corresponding cell row; and a cell-to-cell connection line connecting the signal connection cells together and having a broader connection width than that of an ordinary connection line.

In the semiconductor integrated circuit device of the present invention the signal connection cells are connected together by the cell-to-cell connection line whose connection width is broader than that of the ordinary connection line, resulting in a signal being propagated to the associated cell in a low-resistance fashion. Furthermore, the signal connection cells are arranged at the respective cell rows so as to be located on a single straight line and it is, therefore, possible to connect the respective signal connection cells together by the cell-to-cell connection line so that a distance of the signal connection line can be reduced. A signal coming from the signal connection cell is supplied in a row unit to the associated cell in the respective cell row via the line for cell rows, so that a signal is propagated over a minimum connection line length.

According to the present invention, as set out above, a semiconductor integrated circuit device is provided which can reduce a signal connection line length and achieve a low-resistance feature so that the phase shift of a signal waveform, as well as the deformation of the signal waveform at an output of the cell to which it is supplied from a clock driver cell, occurs.

DETAILED DESCRIPTION OF THE PREFERRED EMBODIMENTS

The embodiment of the present invention will be explained below with reference to the accompanying drawings.

Figure 3:
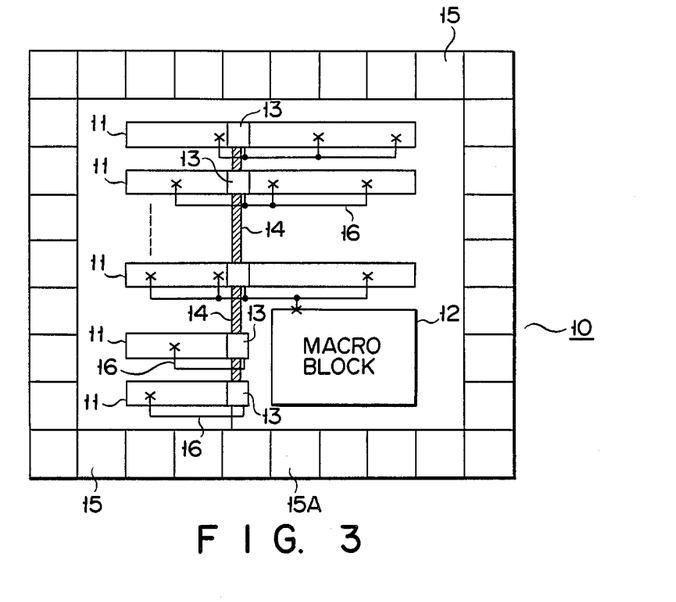
FIG. 3 is a plan view showing a pattern of an IC chip as obtained by incorporating a semiconductor integrated circuit device into an associated integrated circuit of a standard cell type.

FIG. 3 is a plan view showing an IC chip pattern obtained by incorporating an invention into a standard cell type integrated circuit.

In FIG. 3, IC chip body 10 includes a plurality of cell rows 11 each having a plurality of cells and macro block 12, such as a memory. In respective cell rows 11, signal connection cells 13 are each so provided as to be located on a single line across the cell row array. These signal connection cells 13 are mutually connected by cell-to-cell connection line 14 whose width is broader than that of those ordinary lines in the respective cell rows.

A plurality of I/O cells 15 are provided around chip body 10 and, of I/O cells, I/O cell 15A is a clock driver cell of a greater driving capability which receives a clock signal. The clock signal is amplified by clock driver cell 15A and coupled via a corresponding signal line to signal connection cell 13 at a location nearest to cell 15A.

Connection line 16 for cell rows which has a width equal to that of the ordinary connection line is connected to signal connection cell 13. Through cell row connection line 16 the clock signal is supplied to a clock signal demand standard cell, such as a standard flip-flop cell.

Figure 4:
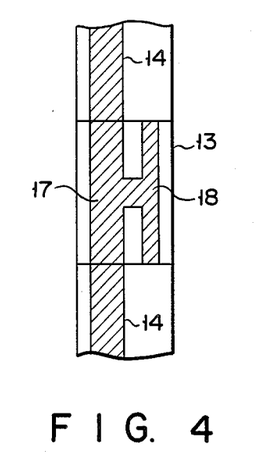
FIG. 4 is a plan view showing a detailed pattern of a signal connection cell in FIG. 3.

FIG. 4 is a plan view showing a detailed pattern of signal connection cell 13 in the aforementioned integrated circuit. Signal connection cell 13 has a metal connection layer, such as aluminum as well as input-side connection line 17 equal in width to connection line 14 and output-side connection line 18 connected to input-side connection line 17 and having a width equal to that of the ordinary connection line. Input side connection line 17 is connection to cell-to-cell connection line 14 and output side connection line 18 is connected to cell row connection line 16, not shown in FIG. 4.

Figure 5:
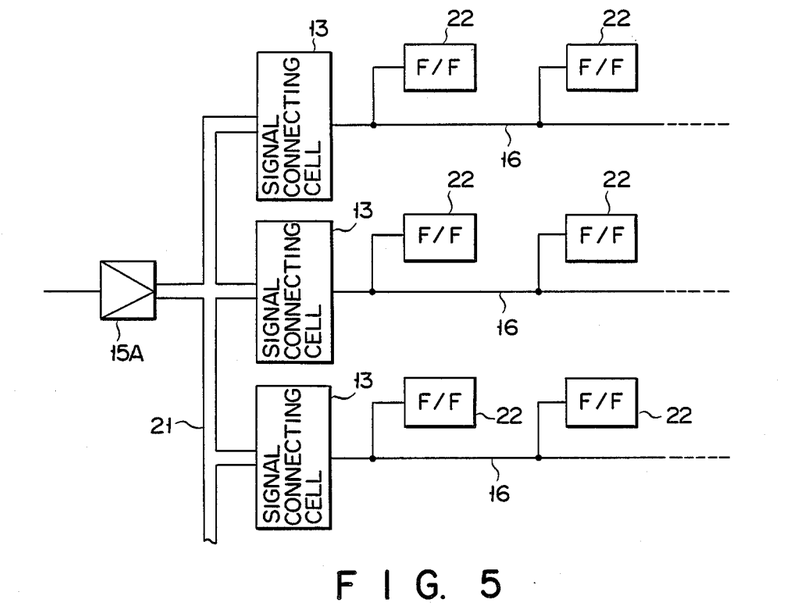
FIG. 5 is a view showing a signal connection line between a clock driver cell and standard cells in the respective cell row in the semiconductor integrated circuit device of FIG. 3.

FIG. 5 is an equivalent circuit showing a relation of signal connection lines between the clock driver cell and standard cells in the respective cell row. In FIG. 5, connection line 21 indicated by a broad line comprises input-side connection line 17 and cell-to-cell connection line 14 both having a corresponding connection line in signal connection cell 13. As will be evident from FIG. 5, a clock signal is propagated from clock driver cell 15A via connection line 21 to the cell row position. Connection line 21 has a greater width and extends on a straight line as shown in FIG. 3 so as to obtain a minimum connection line. It is thus possible to obtain an adequately small resistive value. As a result, the delay times for a signal to reach the respective cell rows become adequately small and equal to each other. A clock signal is supplied from respective connection cell 13 to a clock signal demand standard cell, such as a flip-flop (F/F) cell, in the respective row via connection line 16 for the corresponding cell row. It is thus possible to provide a minimum connection line length for connection line 16 with the ordinary connection line of the aforementioned width, and to solve, for example, a "clock skew" problem.

According to the aforementioned embodiment, it is possible to reduce the length of a signal connection line, as well as to achieve a low resistance feature, when a clock signal is propagated. This arrangement can suppress the generation of the phase displacement of a clock signal and reduce the deterioration of an output waveform when being propagated from the clock drive cell to the respective cell.

Figure 6:
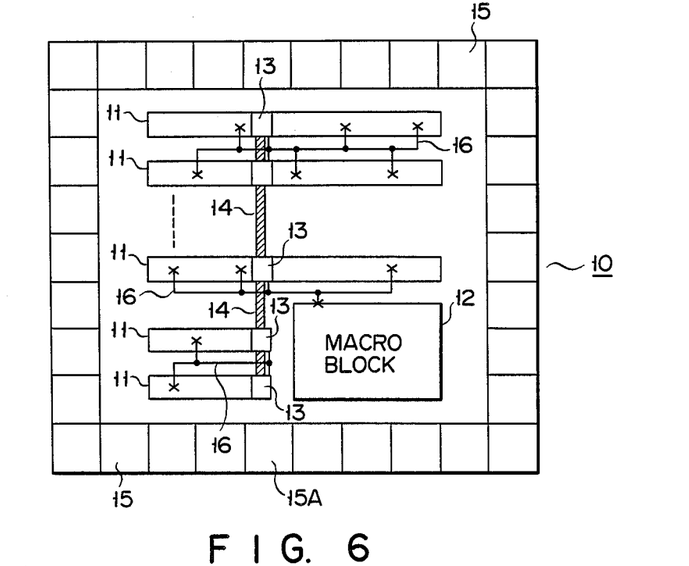
FIG. 6 is a plan view showing an IC chip pattern of a semiconductor integrated circuit device, according to another embodiment of the present invention, which is applied to a standard cell type integrated circuit.

FIG. 6 is a plan view showing an IC chip pattern when the semiconductor IC device of the present invention is applied to a standard cell type integrated circuit. In this embodiment, connection line 16 for cell rows is shared between two respective adjacent cell rows, thus allowing the reduction of the length of a connection line for propagating a clock signal so that the clock signal can drive the corresponding cell without loosing an enhanced drive capability.

Figure 7:
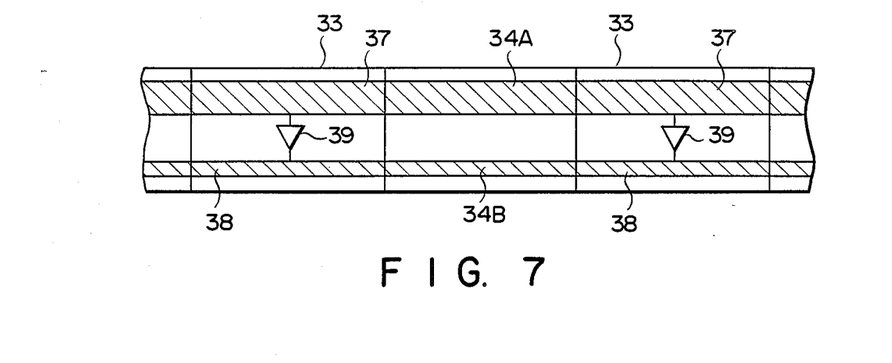
FIG. 7 is a plan view showing a pattern of a signal connection cell in a semiconductor integrated circuit device, according to another embodiment of the present invention, which is applied to a standard cell type integrated circuit.

FIG. 7 is a plan view showing a cell configuration pattern for signal connection when a semiconductor device of the present invention is applied to a standard cell type integrated circuit. In this embodiment, cell 33 for signal connection includes input-side connection line 37 and output-side connection line 38 both made of a metal connection line, such as aluminum, and amplifier 39 connected between input-side connection line 37 and output-side connection line 38.

In the integral circuit having signal connection cells, a cell-to-cell connection line is of two type: connection line 34A and connection line 34B. Input-side connection line 37 in the signal connection cell is connected to cell-to-cell connection line 34A of a broader connection width than that of the ordinary connection line and to cell-to-cell connection line 34 whose width is equal to that of the ordinary connection line. Output-side connection line 38 in the signal connection cell is connected to connection line 16, not shown in FIG. 7, for cell rows.

Figure 8:
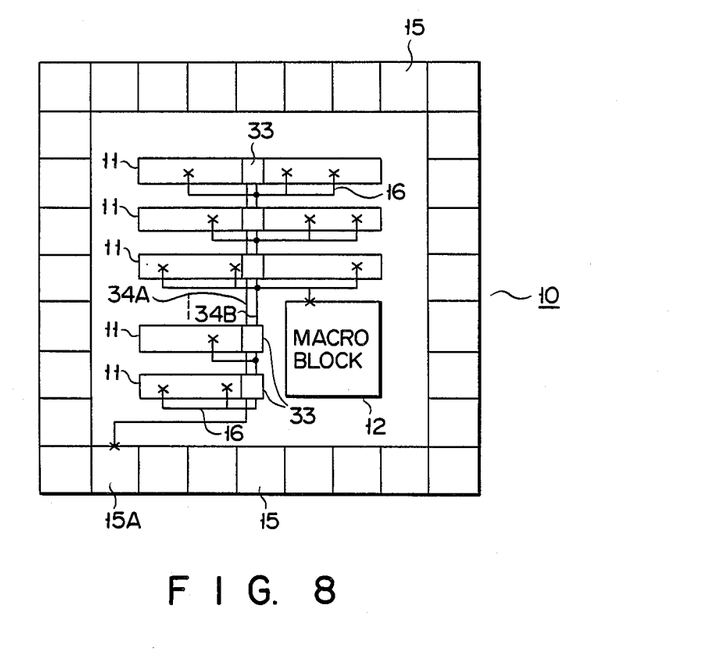
FIG. 8 is a plan view showing an IC chip pattern including a signal connection cell in FIG. 7.

FIG. 8 is a plan view showing an IC chip configuration pattern with signal connection cells shown in FIG. 7 incorporated therein. In the embodiment shown in FIG. 8, amplifier 39 is connected between input-side connection line 37 and output-side connection line 38 in respective signal connection cell 33 so that a clock signal is supplied to the respective cell row with an enhanced cell drive capability.

Figure 9:
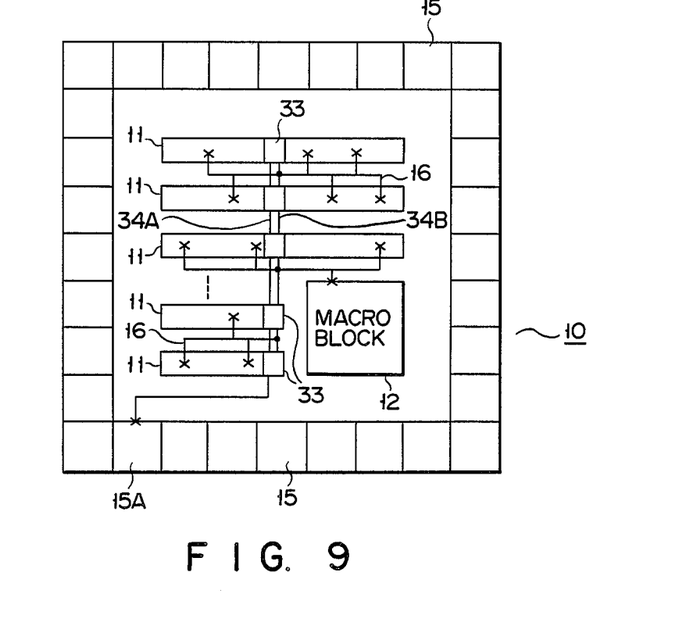
FIG. 9 is a plan view showing an IC chip pattern of a semiconductor integrated circuit, according to another embodiment of the present invention, which includes signal connection cells shown in FIG. 7.

FIG. 9 is a plan view showing an IC chip configuration pattern in a semiconductor IC device, with the signal connection cells (FIG. 7) incorporated therein, according to another embodiment of the present invention. In the embodiment, connection line 16 for cell rows is provided for every two adjacent cells as in the embodiment shown in FIG. 6. According to the present invention, it is possible to reduce the length of a connection line for propagating a clock signal and hence to provide an enhanced cell drive capability with which a clock signal is propagated to the associated cell.

Figure 10:
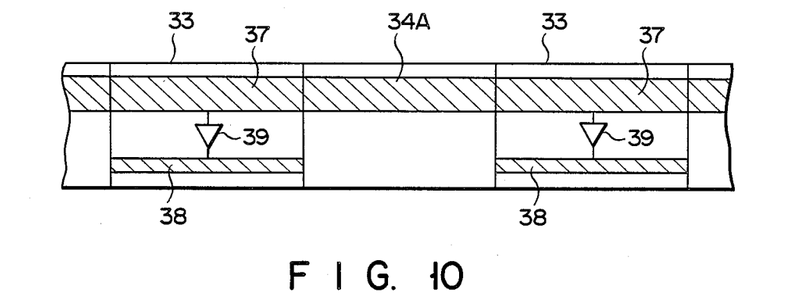
FIG. 10 is a plan view showing a configuration pattern of a signal connection cell in a semiconductor integrated circuit device, according to another embodiment of the present invention, which is applied to a standard cell type integrated circuit.

FIG. 10 is a plan view showing a connection cell configuration pattern for signal connection in a semiconductor IC device, with a standard cell type integrated circuit incorporated therein, according to another embodiment of the present invention. In the embodiment shown in FIG. 10, signal connection cells 33 include input-side connection line 37, output-side connection line 38 and amplifier 39 as in FIG. 7. The cell-to-cell connection line is constituted by one type of connection line 34A whose width is greater than that of the ordinary connection line. Only input-side connection line 37 in the signal connection cell is connected to each other via cell-to-cell connection line 34A. This type of the integrated circuit is advantageous in the case where the number of clock signal demand cells in the respective cell row is averaged.

The present invention is not restricted to the aforementioned embodiment and can be changed in a variety of ways without being restricted to the aforementioned embodiments. Although, in the aforementioned respective embodiments, a clock signal has been explained as being supplied or propagated via the signal connection cell, the present invention can also been reduced to practice if an ordinary signal is used in place of the clock signal.

What is claimed is:

1. A semiconductor integrated circuit device comprising:
   a plurality of cell rows each including a plurality of standard cells;
   signal connection cells provided one at each of said cell rows and located on a straight line perpendicular to the respective cell rows;
   a connection line for cell rows which is connected to the signal connection cells to allow a signal which is propagated via the signal connection cell to be supplied to the cell in the cell row; and
   cell-to-cell connection lines each connected between the signal connection cells and having a greater width than that of an ordinary connection line.

2. The semiconductor integrated circuit device according to claim 1, in which said signal connection cells have a connection line for propagating a signal.

3. The semiconductor integrated circuit device according to claim 2, in which said connection line has a width equal to that of said cell-to-cell connection line and includes an input-side connection line connected to the cell-to-cell connection line and an output-side connection line connected to said input-side connection line and said cell line for cell rows and having a width equal to that of said ordinary connection line.

4. The semiconductor integrated circuit device according to claim 3, further including an amplifier connected at an input terminal to said input-side connection line and at an output terminal to said output-side connection line.

5. The semiconductor integrated circuit device according to claim 1, in which said connection line for cell rows is provided between adjacent ones of said cell rows to propagate a signal to the cell in the cell row.

* * * * *

REEXAMINATION CERTIFICATE (1931st)

United States Patent [19]
Morimoto et al.

[11] B1 4,883,980
[45] Certificate Issued Feb. 23, 1993

[54] SEMICONDUCTOR IC (INTEGRATED CIRCUITS) DEVICE

[75] Inventors: Toshiki Morimoto, Kawasaki; Seiji Watanabe, Yokohama, both of Japan

[73] Assignee: Kabushiki Kaisha Toshiba, Kawasaki, Japan

Reexamination Request:
No. 90/002,577, Feb. 12, 1992

Reexamination Certificate for:
Patent No.: 4,883,980
Issued: Nov. 28, 1989
Appl. No.: 238,229
Filed: Aug. 26, 1988

[30] Foreign Application Priority Data
Aug. 27, 1987 [JP] Japan .................. 62-213545

[51] Int. Cl.$^5$ .............. H01L 27/10; H01L 23/50; H01L 23/52; H03K 3/01
[52] U.S. Cl. .............. 307/465.1; 307/482.1; 307/303.1; 357/45; 357/42; 357/68
[58] Field of Search ........... 357/45, 42, 68, 40; 307/465, 465.1, 303, 303.1, 480, 482.1, 465.1

[56] References Cited

U.S. PATENT DOCUMENTS

| | | | |
|---|---|---|---|
| 4,661,721 | 4/1987 | Ushiku | 328/105 |
| 4,851,717 | 7/1989 | Yabe | 307/465 |
| 4,870,300 | 9/1989 | Nakaya et al. | 307/303 |
| 4,904,887 | 2/1990 | Sugiyama et al. | 307/467 |

FOREIGN PATENT DOCUMENTS

| | | | |
|---|---|---|---|
| 58-157149 | 9/1983 | Japan | 357/45 M |
| 60-130142 | 7/1985 | Japan | 357/45 M |

*Primary Examiner*—Timothy P. Callahan

[57] ABSTRACT

A semiconductor integrated circuit device is disclosed which comprises a plurality of cell rows each including a plurality of standard cells, signal connection cells provided one at each of the cell rows and located on one straight line across that cell row array, a line for connection cells which is connected to the signal connection cell and adapted to supply a signal which is propagated via the signal connection cell to the cell in the corresponding cell row, and cell-to-cell connection lines each connecting the signal connection cells together and having a broader connection width than that of an ordinary connection line. In the semiconductor integrated circuit device of the present invention the respective signal connection cells are connected together by the cell-to-cell connection line having a broader connection width than that of the ordinary connection line, so that a signal is propagated to the respective cell row in a low-resistance way. The respective signal connection cells are each arranged at the respective cell row in a manner to be located on a single straight line to achieve the reduction of a distance between the signal connection lines. Since a signal coming from the signal connection cell at each cell row is supplied in a row unit to the associated cell in the respective cell row via the connection line for cell rows, a signal propagation over a minimum connection line length is assured.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, lines 27–37.

In the integral circuit having signal connection cells, a cell-to-cell connection line is of two [type] *types*: connection line 34A and connection line 34B. Input-side connection line 37 in the signal connection cell is connected to cell-to-cell connection line 34A of a broader connection width than that of the ordinary connection line and to cell-to-cell connection line [34] *34B* whose width is equal to that of the ordinary connection line. Output-side connection line 38 in the signal connection cell is connected to connection line 16, not shown in FIG. 7, for cell rows.

AS A RESULT OF REEXAMINATION, IT HAS BEEN DETERMINED THAT:

Claims 1–5 are determined to be patentable as amended.

1. A semiconductor integrated circuit device comprising:
   a plurality of cell rows each including a plurality of standard cells;
   signal connection cells provided one [at] *in* each of [said] *the* cell rows and located on a straight line perpendicular to the [respective] cell rows;
   [a connection line] *signal lines* for cell rows [which is] connected to [said] *the* signal connection cells to allow a signal which is propagated via the signal connection [cell] *cells* to be supplied to the [cell] *cells* in the *respective* cell [row] *rows*; and
   [cell-to-cell connection] *row-to-row signal* lines each connected between the signal connection cells and *supplying the signal to said signal connection cells, said row-to-row signal lines* having a *width* greater [width] than that of [an ordinary connection line] *said signal lines for cell rows*.

2. The semiconductor integrated circuit device according to claim 1, [in which] *wherein* said signal connection [cells have a connection line] *cell has signal distribution means* for propagating a signal.

3. The semiconductor integrated circuit device according to claim 2, [in which] *wherein* said [connection line has a width equal to that of said cell-to-cell connection line and includes an input-side connection line connected to the cell-to-cell connection line and an output-side connection line connected to said input-side connection line and said cell line for cell rows and] *signal distributing means comprises a signal receiving member for receiving said signal from said row-to-row signal lines and a signal distributing member for distributing said signal from said row-to-row signal lines to each of said signal lines, said signal receiving member* having a width equal to that of said [ordinary connection line] *row-to-row signal lines*.

4. The semiconductor integrated circuit device according to claim 3, further including an amplifier [connected at an] *whose* input terminal *is connected* to said input-side [connection] *signal* line and [at an] *whose* output terminal *is connected* to said output-side [connection] *signal* line.

5. The semiconductor integrated circuit device according to claim 1, [in which said connection line for cell rows is provided between adjacent ones of said cell rows to propagate a signal to the cell in the cell row] *wherein each of said signal lines for cell rows is provided between adjacent cell rows to propagate signals to cells of the adjacent cell rows*.

* * * * *